United States Patent [19]

Mahawili

[11] Patent Number: 4,993,358
[45] Date of Patent: Feb. 19, 1991

[54] CHEMICAL VAPOR DEPOSITION REACTOR AND METHOD OF OPERATION

[75] Inventor: Imad Mahawili, Sunnyvale, Calif.

[73] Assignee: Watkins-Johnson Company, Palo Alto, Calif.

[21] Appl. No.: 386,903

[22] Filed: Jul. 28, 1989

[51] Int. Cl.$^5$ .............................. C23C 16/00
[52] U.S. Cl. ................... 118/715; 427/248.1
[58] Field of Search ............ 118/715; 156/345, 643; 204/298; 427/248.1, 255.1, 255.2

[56] References Cited

U.S. PATENT DOCUMENTS

| | | | |
|---|---|---|---|
| 3,093,507 | 6/1963 | Lander et al. | 437/239 |
| 3,633,537 | 1/1972 | Howe | 118/48 |
| 3,696,779 | 10/1972 | Murai et al. | 118/48 |
| 3,750,620 | 7/1973 | Eversteijn et al. | 118/48 |
| 3,757,733 | 9/1973 | Reinberg | 118/49.5 |
| 3,783,822 | 1/1974 | Wollam | 118/49.1 |
| 3,922,467 | 11/1975 | Pinchon | 428/411 |
| 4,058,430 | 11/1977 | Suntola et al. | 156/611 |
| 4,142,004 | 2/1979 | Hauser, Jr. et al. | 427/39 |
| 4,262,631 | 4/1981 | Kubacki | 204/164 |
| 4,282,267 | 8/1981 | Kuyel | 427/38 |
| 4,596,208 | 6/1986 | Wolfson et al. | 118/712 |
| 4,599,135 | 7/1986 | Tsunekawa et al. | 156/643 |

FOREIGN PATENT DOCUMENTS

| | | | |
|---|---|---|---|
| 54-111771 | 9/1979 | Japan | 118/715 |
| 60-189928 | 9/1985 | Japan | 118/715 |
| 62-81019 | 4/1987 | Japan | 118/715 |
| 62-139875 | 6/1987 | Japan | 118/715 |
| 63-57775 | 3/1988 | Japan | 118/715 |
| 63-99243 | 4/1988 | Japan | 118/715 |

*Primary Examiner*—Norman Morgenstern
*Assistant Examiner*—Terry J. Owens
*Attorney, Agent, or Firm*—Thomas E. Schatzel

[57] ABSTRACT

A chemical vapor deposition (CVD) reactor and method are disclosed wherein a chamber, preferably configured for receiving a single wafer as a deposition substrate, has multiple gas inlet orifices and exhaust ports which are independently adjustable for dynamically varying and controlling directionality of local gas flow vectors toward and past the deposition substrate. The injection angle of reactant gas being introduced into the chamber is adjusted by baffles for statically deflecting gas flow entering the chamber. Adjustment of the gas inlet orifices and/or exhaust ports and adjustment of the injection angle for the reactant gas is selected for achieving enhanced coating uniformity, and conformality of deposition if necessary or desired, on the substrate.

29 Claims, 6 Drawing Sheets

CHEMICAL VAPOR DEPOSITION REACTOR AND METHOD OF OPERATION

FIELD OF THE INVENTION

The present invention relates to a chemical vapor deposition (CVD) method and reactor design and more particularly to a CVD method and reactor design wherein deposition is initiated by placing the substrate in a reactant gas environment.

BACKGROUND OF THE INVENTION

CVD methods and reactor devices have long been employed for depositing films of materials such as polycrystalline silicon, silicon dioxide (either doped or undoped), silicon nitride, etc. on selected substrates. Each of these materials may be deposited by a variety of techniques and for a variety of applications.

Generally, the material to be deposited is dependent upon selection of a reactant gas from which the material is deposited and various conditions of the process. A further discussion as to the chemistry of such deposition processes is not provided herein. Rather, it is merely noted that the CVD method and reactor device of the present invention are suitable for use with most materials contemplated for CVD applications.

A substantial number of CVD reactor designs have been employed in the past for carrying out such deposition techniques. These reactors are commonly characterized as providing a reaction chamber forming a controlled envelope or environment, preferably in terms of pressure and temperature, wherein position is initiated from a reactant gas onto a selected substrate.

As noted above, the reactant gas may include one or more gases taking part in the deposition process as well as inert gases which serve as background or carrier gases during the deposition process.

Additional details concerning the chemistry of such CVD processes are described for example in a copending and commonly assigned U.S. patent application entitled "Method of Depositing Silicon Dioxide Film and Product", and in many other references well known to those skilled in the CVD art.

In any event, it is important to understand that the selected CVD process is of critical importance in achieving uniformity of coating on the substrate, particularly where the substrate is a semiconductor wafer, for example. The importance of the CVD processes is even further emphasized by the need for precise definition on a one micron scale, where conformance of deposition is also of critical importance.

Prior CVD reactors tend to be capable of classification in a number of groups summarized immediately below.

"Horizontal systems" tend to be characterized by a holder for the substrate or wafers arranged for example in a tube with gas flowing through the tube to achieve deposition.

So-called "vertical systems" include a susceptor for holding wafers in a chamber typically formed by an inverted bell jar. The susceptor is typically rotated for achieving greater uniformity in coating across the surface of the wafers or substrate.

In "cylindrical or barrel systems", the substrates or wafers are typically placed in vertical alignment either on the inner or outer surface of a cylindrical susceptor. Typically, the susceptor is rotated within a chamber while reactant gases are introduced laterally to achieve deposition on the wafers.

Still other CVD reactors are characterized as "gas-blanketed downflow systems" wherein reactant gases are caused to flow downwardly through vertical channels while the substrates or wafers are arranged upon a holder or susceptor moving horizontally beneath the vertical channels to permit deposition from the gases.

It may generally be seen that CVD reactors of the types outlined above are also commonly characterized by means for regulating gas flow past the substrate during deposition. Timing and sequencing controls are also necessary and may vary in complexity to assure proper control of the deposition technique.

CVD reactors are also characterized by the need for effluent or exhaust means for removing unreacted gas and possibly carrier gas from the chamber as necessary.

CVD reactors which can generally be classified under one or more of the above types have been disclosed for example in U.S. Pat. Nos. 4,599,135; 4,596,208; 4,282,267; 4,142,004; 4,058,430; 3,922,467; 3,783,822; 3,757,733; 3,750,620; 3,696,779; 3,633,537; and 3,093,507.

SUMMARY OF THE INVENTION

In any event, particularly because of the need for achieving ever greater uniformity of coating, and conformality of deposition especially on geometric substrates, there has been found to remain a need for further improvements in CVD reactors and methods of operation for such reactors.

It is accordingly an object of the invention to provide a CVD reactor design and method of operation for such a reactor in order to achieve enhanced coating uniformity and enhanced conformance of deposition, particularly for substrates including but not limited to semiconductor devices and the like.

It is a further object of the invention to provide a CVD reactor with a housing forming a closed chamber suitable for maintaining a wafer or deposition substrate in a controlled environment of selected pressure, etc. With the substrate supported in the chamber, and maintained at typical CVD temperatures, it is subjected to a deposition environment formed with means for introducing reactant gas into the chamber. Multiple exhaust vents arranged in spaced apart communication with the chamber are regulated by respective valve means in order to induce a selected pattern of flow vectors for the reactant gas in the chamber adjacent the substrate in order to enhance deposition uniformity. With the deposition substrate preferably being a silicon or gallium arsenide wafer, for example, operation of the valve means as described above also enhances deposition conformance.

Preferably, the chamber is cylindrical with the substrate supported at one axial end of the chamber and a wall spaced apart from the substrate at the opposite axial end of the chamber. Within such a configuration, the exhaust vents are preferably formed about the cylindrical periphery of the chamber.

Even more preferably, one or more additional exhaust vents is centrally arranged in the chamber, both the peripheral exhaust vents and the centrally arranged exhaust vents being operated in sequence by the valve means for inducing selected reactant gas flow vector patterns including clockwise swirling motion, counterclockwise swirling motion, radial inward motion, radial outward motion and combinations thereof. Patterns for local flow vectors capable of being produced by the present invention as summarized above are not limited to those specified above which are set forth only by way of example to facilitate an understanding of the invention.

More preferably, the means for introducing reactant gas into the chamber comprise multiple spaced apart orifices, sets of the orifices being in communication with external manifolds preferably of annular configuration. The arrangement of the external annular manifolds permits the use of separate regulators in order to introduce one or more gases including reactant gases, carrier gases and the like as necessary for a particular deposition process being contemplated. The invention also contemplates possible use of a portion of the orifices as additional exhaust vents in order to make the CVD reactor or apparatus even more versatile.

The CVD gas injection apparatus also preferably includes adjustable baffle means associated with the orifices or other means for introducing reactant gases in order to control or adjust the injection angle of the gases being introduced into the chamber.

It is a related object of the invention to provide a method of chemical vapor deposition wherein a deposition substrate or wafer is arranged in a closed chamber with reactant gas being introduced into the chamber. Multiple exhaust vents are connected in spaced apart relation with the chamber and selectively regulated between opened and closed condition in order to induce a selected pattern or patterns of flow vectors for the reactant gas in the chamber adjacent the substrate in order to enhance deposition uniformity and preferably to also enhance deposition conformance.

Preferably, the CVD method of the invention includes additional steps or limitations similar to those noted above in connection with the CVD reactor.

Additional objects and advantages of the invention are made apparent in the following description having reference to the accompanying drawings.

DESCRIPTION OF THE PREFERRED EMBODIMENTS

Figure 1:
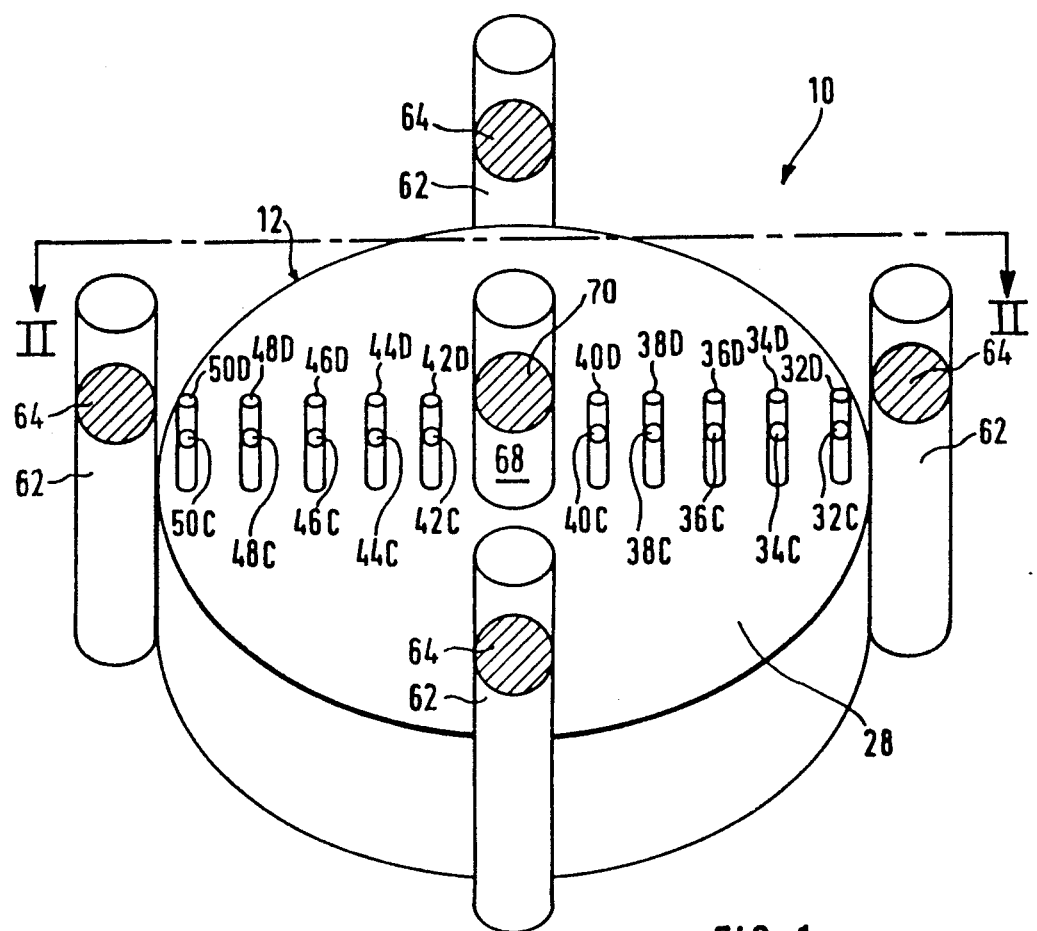
FIG. 1 is a pictorial representation of a CVD reactor constructed according to the present invention, portions of the reactor being illustrated schematically.
Figure 2:
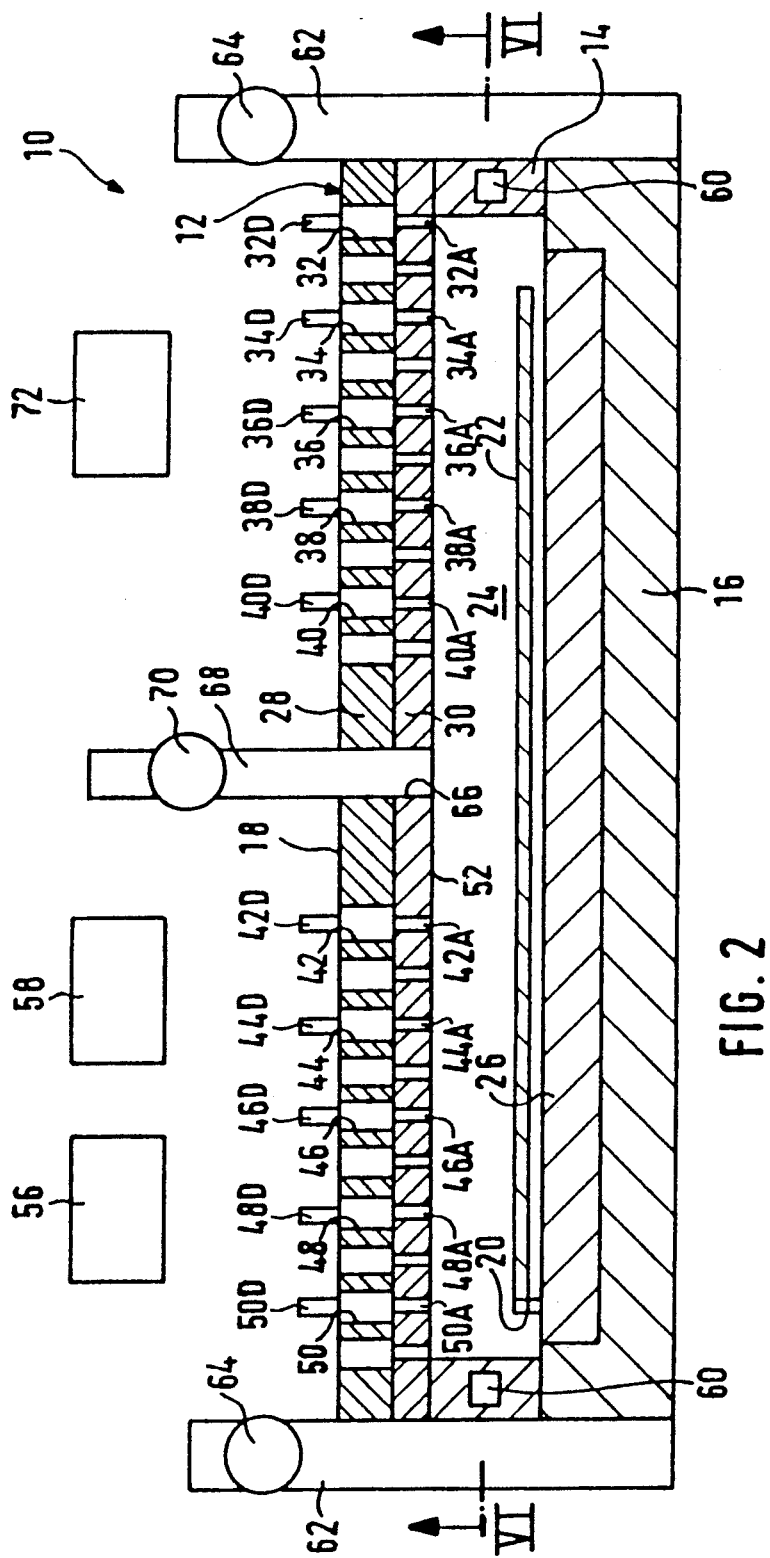
FIG. 2 is a view taken along section lines II—II in FIG. 1 in order to better illustrate internal construction of the reactor.

Referring now to the drawings and particularly to FIGS. 1 and 2, a CVD reactor is generally indicated at 10 which includes the various details of construction as listed above while also being capable of operation in the manner summarized above.

The CVD reactor 10 includes a housing 12 formed by a cylindrical shell 14 of relatively short axial length. The axial ends of the cylindrical shell 14 are closed by generally flat walls or sub-housings 16 and 18. The lower wall 16 is, in effect, a heater housing including two or more pins 20 for supporting a substrate or wafer 22 within a chamber 24 formed by the cylindrical shell 14 between the axially arranged housings 16 and 18. The lower wall or heater housing 16 includes a heater element 26 arranged adjacent the support pins 20. The heater element 26 is preferably provided for heating the wafer or substrate 22 to an appropriate processing temperature, as is well known to those skilled in the art.

The upper wall 18 is an injector housing preferably formed from two plates 28 and 30, the plate 30 forming an upper surface for the chamber 24 and the other plate 28 being arranged externally from the chamber.

Figure 6:
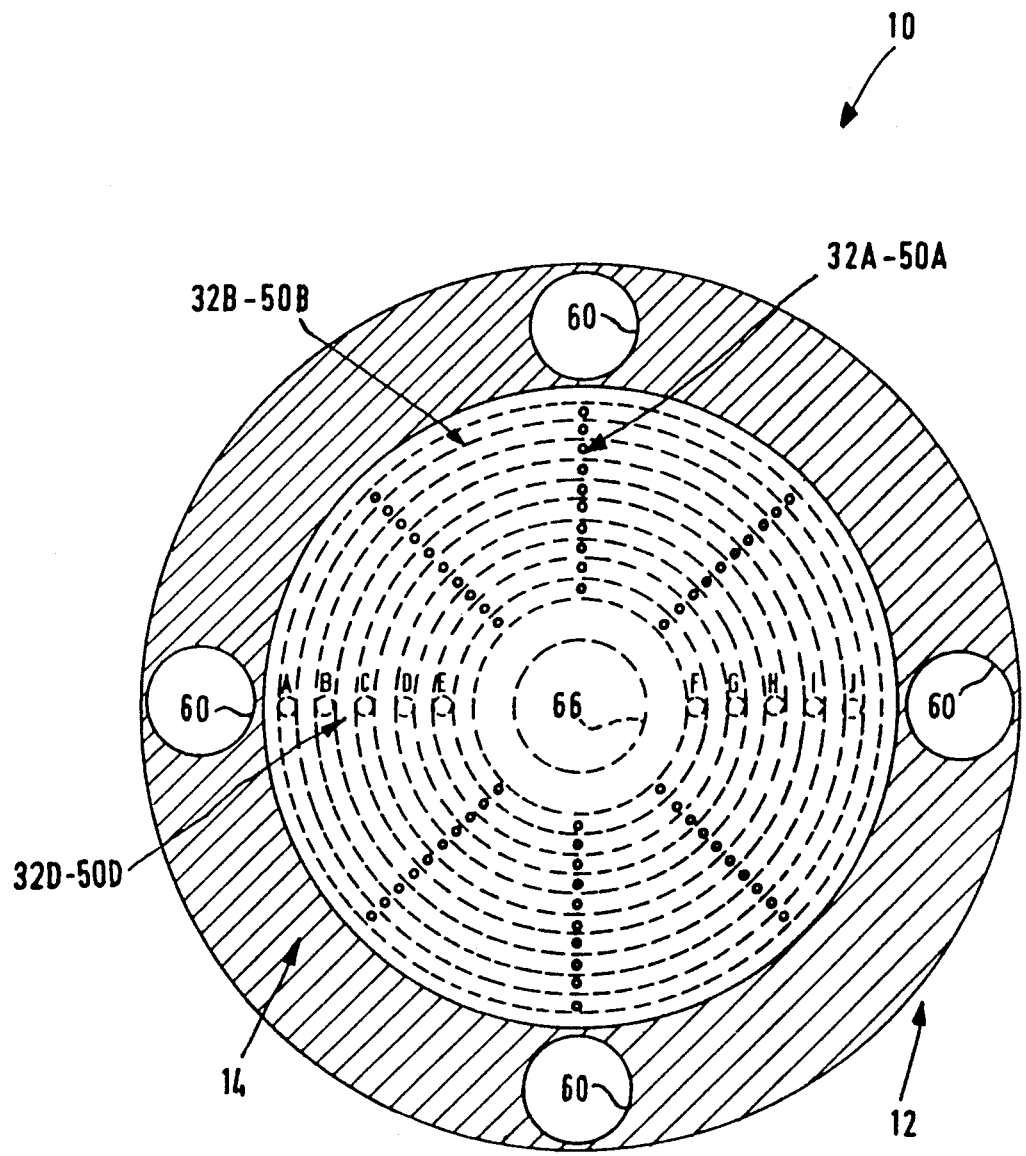
FIG. 6 is a view taken along section line VI—VI of FIG. 2 better illustrate arrangement of the gas inlet orifices, without the baffles, and manifolds interconnecting the orifices with regulators for the respective manifolds.

The upper or external plate 28 forms ten radially spaced gas manifolds 32-50, all of the manifolds being of annular construction, as may be best seen in FIG. 6. The inner plate 30 forms an array of gas inlets, preferably sonic orifices generally indicated at 32A-50A. Referring again to FIG. 6, it may be seen that a cylindrical arrangement of the orifices corresponds with each of the manifolds 32-50 in order to provide restrictive communication for gas from the manifolds into the chamber 24. The sonic orifices 32A-50A are preferably formed as inserts from hardened metal in order to prevent or minimize deterioration from reactant gas entering the chamber 24. Preferably, each cylindrical array includes approximately twelve orifices, at least adjacent the radially outer portions of the chamber 24. However, only six orifices are illustrated in each circumferential series in FIG. 6 in order to better illustrate other components of the reactor.

Figure 3:
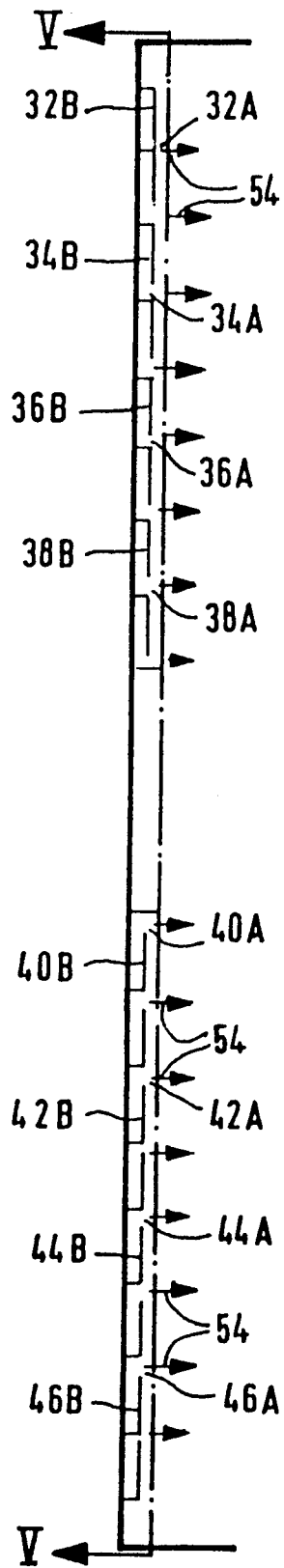
FIG. 3 is an enlarged fragmentary view similar to FIG. 2 for better illustrating baffles mounted adjacent gas inlet orifices for statically regulating directionality of gas entering a chamber within the reactor.
Figure 4:
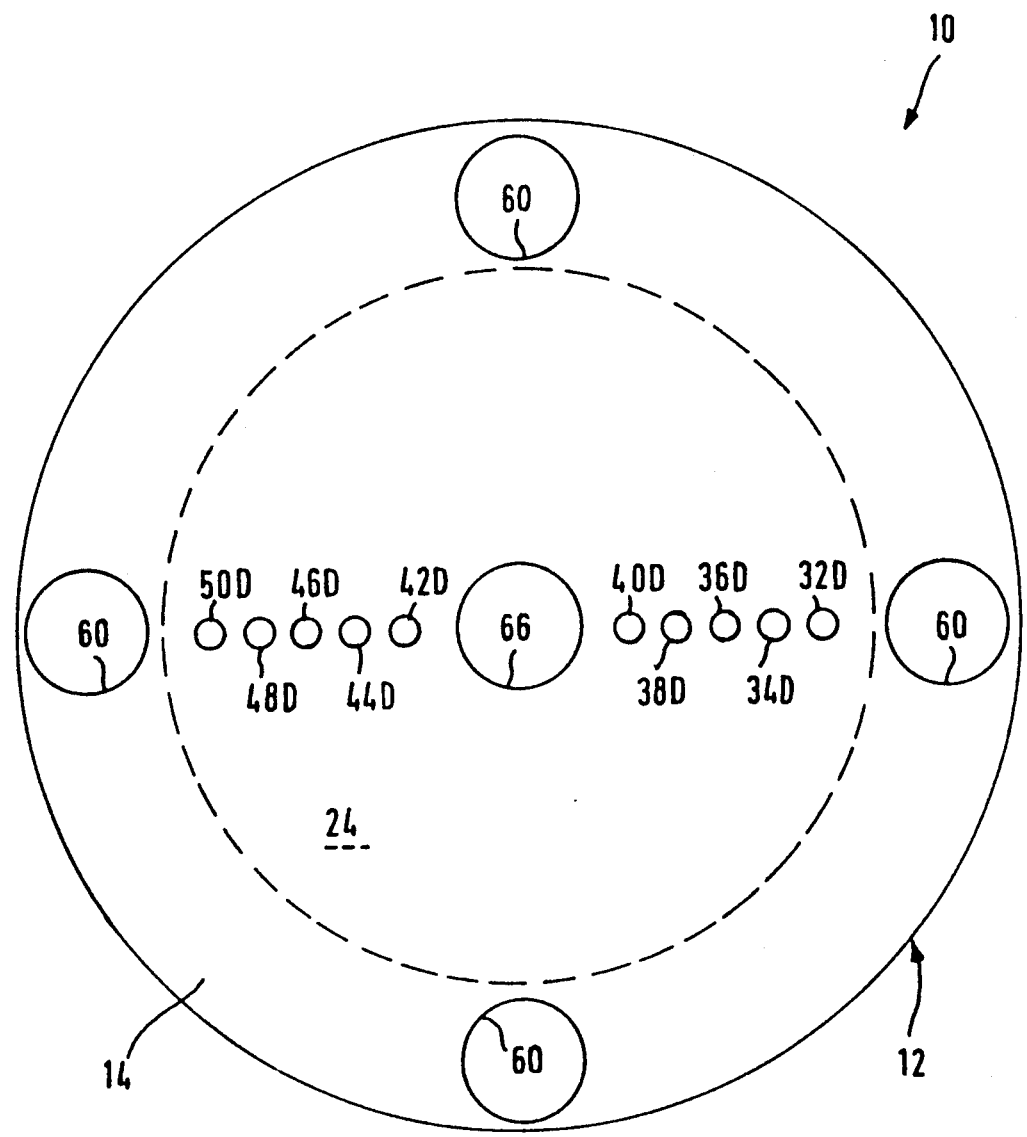
FIG. 4 is a plan view of the reactor.
Figure 5:
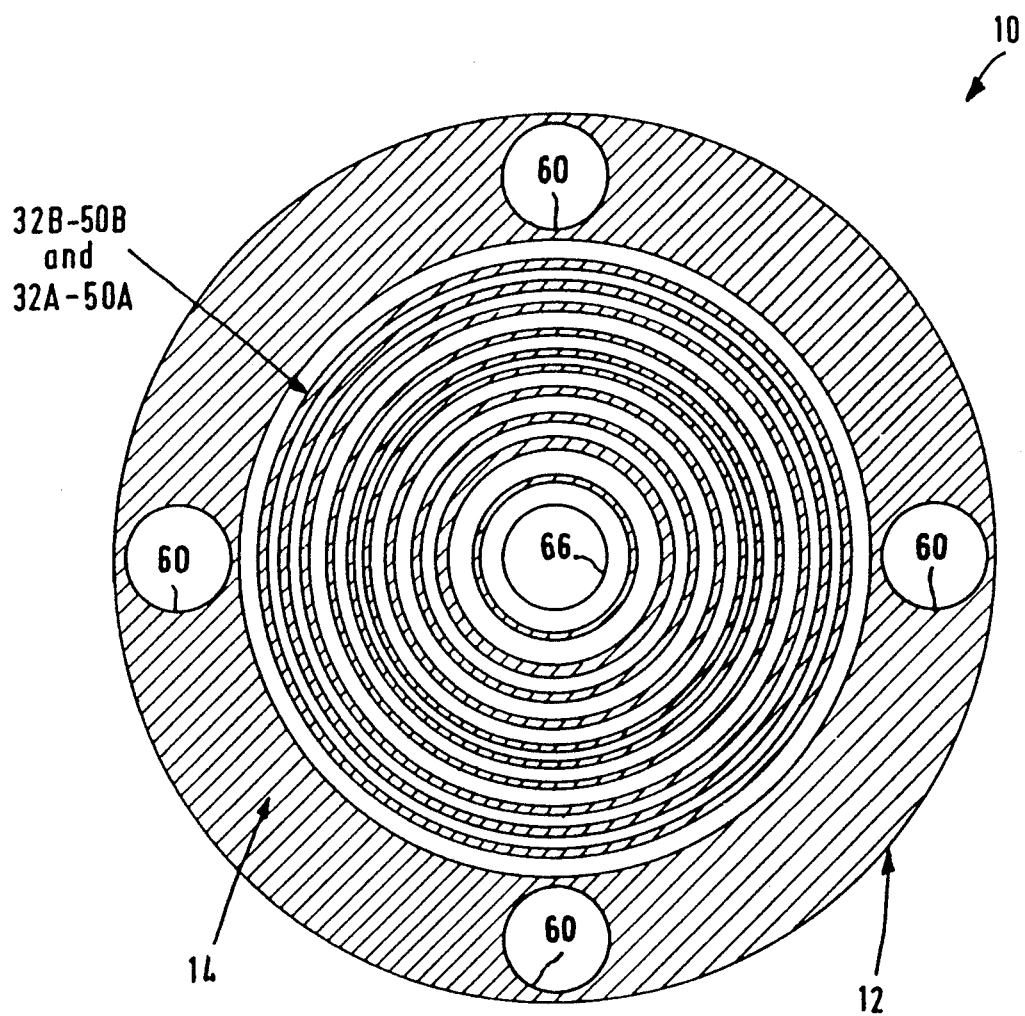
FIG. 5 is a view taken along section line V—V of FIG. 3 to illustrate annular construction of the baffles.

Referring particularly to FIG. 3, annular baffles 32B-50B are secured to an inner surface 52 of the plate 30 adjacent the respective circumferential arrays of orifices 32A-50A. As illustrated in FIG. 3, the baffles 32B-50B are adjustable and are configured for statically determining or regulating directionality of gas flow from the orifices 32A-50A into the chamber 24 as represented by the arrows 52.

Referring again to FIG. 2, each of the annular gas manifolds 32-50 is provided with an external valve or regulator 32C-50C in an inlet conduit 32D-50D. The external regulators are adapted for connection with one or more sources of reactant gases such as those schematically indicated at 56 and 58. Depending upon the specific application, different numbers of individual gas source could be employed. In any event, the two sources 56 and 58 indicate the possibility of combining two or more gases to form the reactant gas environment within the chamber 24. For example, in the deposition of silicon dioxide, the two sources 56 and 58 could provide silane and oxygen. However, as noted above, a wide variety of other gases could be employed as contemplated by the present invention In any event, the gas sources 56 and 58 are selectively connected with one or more of the external regulators in order to assure optimum flow conditions for the reactant gas within the chamber 24. The sources 56 and 58 could be connected with the external regulators, for example, by conduits or the like (not shown). Preferably, gases from both sources 56 and 58 are connected with certain of the external regulators to permit mixing of the gases to form the desired reactant gas within certain of the manifolds prior to introduction of the reactant gas into the chamber 24.

Exhaust vents for regulating the passage or exit of effluent material from the chamber 24 are arranged in spaced apart communication with the chamber 24. Preferably, the cylindrical shell 14 forms exhaust passages 60 circumstantially spaced about the periphery of the chamber 24 in communication with external exhaust members 62 each including a separate control valve 64.

At least one additional exhaust passage 66 is formed in an axially central portion of the chamber 24, preferably by the plates 28 and 30. The exhaust passage 66 is similarly in communication with an external exhaust member 68 having an individual control valve 70. The external exhaust members 62 and 68 may be connected for example with a vacuum pump as schematically indicated at 72, for example by conduit or the like (not shown). Additional exhaust passages (not shown) could be provided in the center of the chamber 24, if desired.

The control valves 64 and 70 are adapted for sequential operation, preferably by automated means (not shown) in order to selectively open or close the individual exhaust passages 60 and 66 between the chamber 24 and vacuum means 72.

The combination of control valves 64 and 70, either alone or in combination with the automated means referred to above, provides a kinetic means for regulating directionality of local flow vectors for reactant gas within the chamber 24 as described in greater detail below in a method of operation for the reactor 10.

The method of operation for the CVD reactor 10 is believed apparent from the preceding description. However, a preferred mode of operation for the reactor 10 is briefly described below in order to assure a more complete understanding of the invention.

Initially, a selected substrate such as a wafer of silicon or gallium arsenide or the like is mounted within the chamber 24 upon the support pins 20. The housing 12 could include means (not shown) adapted for permitting adjustment of axial spacing between the substrate 22 and the upper wall or more specifically its inner plate 30. This could be accomplished, for example, by replacing the cylindrical shell 14 with another component of different axial length or possibly by adjustable means (not shown).

In any event, with the substrate 22 arranged within the chamber 24, a selected combination of the external regulators 32C-50C are interconnected with gas sources such as those indicated at 56 and 58. In typical reactions, at least two of the regulators are connected with the gas sources. For example, at least the external regulators 32C and 50C which are connected with the radially inner and radially outer annular manifolds 32 and 50 are connected with the gas sources for permitting flow of reactant gas into the chamber 24 through the circumferential arrays 3A and 50A of sonic orifices.

However, any combination of the external regulators could be connected with the gas sources. Alternatively, one or more of the external regulators could also be connected with the vacuum pump 72 for certain applications. Such a possibility prove even greater versatility in the reactor of the present invention.

With a selected portion of the regulators connected with the gas sources and the exhaust members 62 and 68 being coupled with the vacuum pump 72, the heater element 26 is preferably energized to heat the substrate 22 to a selected temperature and the vacuum is operated to establish a preferred pressure level within the chamber 24. Pressure within the chamber 24 may be maintained at a low level, for example less than about 1 Torr and as low as 0.1 Torr or at a high pressure condition, of about 1 atmosphere, for example.

With the desired pressure and temperature conditions established in the chamber 24, reactant gas is then introduced through the selected combination of external regulators.

The baffles 32B-50B are adjusted as desired in order to statically adjust directionality of gas flow entering the chamber 24 and approaching the substrate 22. This adjustment of the baffles is of course preferably accomplished prior to the commencement of each deposition process as is the selection of external regulators coupled with the gas sources.

With reactant gas flowing into the chamber 24 through certain if the orifices 32A-50A, the exhaust control valves 64 and 70 are operated sequentially in order to develop or induce selected patterns of local flow vectors for reactant gas within the chamber and adjacent the substrate 22. For example, it may be seen that sequential opening and closing of the peripheral exhaust passages 60, either with the central exhaust passage 66 being open or closed, tends to develop either a clockwise or counterclockwise flow pattern within the chamber. The particular direction depends, of course, upon the sequence in which the external exhaust vents are opened and closed by the control valves 64. Similarly, radial flow of reactant gas within the chamber 24 may be induced by first opening the center exhaust passage 66 and closing one or more of the peripheral exhaust passages 60 and then reversing that pattern to open the peripheral exhaust passages and close the center passage.

Opening and closing of the exhaust passages can of course be performed in various combinations and sequences in order to better regulate the flow of reactant gas along the surface of the substrate 22 and to thereby enhance coating uniformity on the substrate and conformance of deposition if desired or necessary.

In any event, the preceding method of operation is representative of a wide variety of such variations possible through static adjustment of the baffles and selection of the external regulators or connection with the gas sources. At the same time, still greater versatility is made possible by dynamic regulation of directionality through sequential operation of the exhaust control valves as noted above.

Numerous additional modifications and variations will be apparent in addition to those specifically noted above. Accordingly, the scope of the present invention is defined only by the following appended claims which are also exemplary of the invention.

What is claimed is:

1. A chemical vapor deposition (CVD) reactor comprising
   a housing forming a closed cylindrical chamber suitable for maintaining a deposition substrate in an environment of selected pressure,
   means arranged at one axial end of the cylindrical chamber for supporting the substrate,
   a wall spaced apart from the support means and arranged at the other axial end of the cylindrical chamber,
   means for introducing reactant gas into the chamber,
   multiple exhaust vents spaced apart from each other and arranged in communication with the cylindrical chamber about its periphery, and valve means operatively coupled with the individual exhaust vents and sequentially operable for inducing a selected pattern of flow vectors for the reactant gas in the chamber adjacent the deposition substrate in order to enhance deposition uniformity and/or conformance.

2. The CVD reactor of claim 1 further comprising at least one additional exhaust vent arranged in an axially central portion of the end wall, a similar valve means being operatively coupled therewith for inducing the selected pattern of flow vectors for the reactant gas.

3. The CVD reactor or claim 2 wherein the valve means are operable for sequentially opening and closing selected combinations of the exhaust vents in various combinations for inducing selected reactant gas flow vector patterns including clockwise swirling motion, counterclockwise swirling motion, radially inward motion, radially outward motion and combinations thereof.

4. The CVD reactor of claim 3 wherein the means for introducing the reacted gas comprise restrictive orifices communicating at least one reactant gas manifold with the chamber.

5. The CVD reactor of claim 4 further comprising multiple manifolds, the multiple manifolds being annular formed in radially spaced relation with each other adjacent the end wall, and a plurality of circumferentially arranged orifices at multiple radial locations communicating each annular manifold with the chamber.

6. The CVD reactor of claim 5 further comprising regulator means for separately communicating each annular manifold with a gas source or with a vacuum source.

7. The CVD reactor of claim 6 further comprising adjustable baffle means operatively coupled with the orifices for adjusting the injection angle of gas introduced into the chamber.

8. The CVD reactor of claim 7 wherein the baffle means are annularly formed adjacent the circumferentially arranged orifices for each annular manifold.

9. The CVD reactor of claim 4 further comprising adjustable baffle means operatively coupled with the orifices for adjusting the injection angle of gas introduced into the chamber.

10. The CVD reactor of claim 1 further comprising adjustable baffle means operatively coupled with the means for introducing reactant gas into the chamber for adjusting the injection angle of gas introduced into the chamber.

11. The CVD reactor of claim 1 wherein the means for introducing the reactant gas comprise restrictive orifice communicating at least one reactant gas manifold with the chamber.

12. The CVD reactor of claim 11 further comprising multiple manifolds, the multiple manifolds being annularly in radially spaced relation with each other adjacent the end wall, and a plurality of circumferentially arranged orifices at multiple radial locations communicating each annular manifold with the chamber.

13. The CVD reactor of claim 12 further comprising regulator means for separately communicating each annular manifold with a gas source or with a vacuum source.

14. The CVD reactor of claim 1 wherein the chamber and the means for supporting the substrate are configured for receiving a single wafer as the substrate.

15. A chemical vapor deposition (CVD) reactor comprising a housing forming a chamber suitable for maintaining a deposition substrate in an environment of selected pressure,
means for supporting the deposition substrate in the chamber,
means for introducing reactant gas into the chamber,
multiple exhaust vents spaced apart from each other and arranged in communication with the chamber, and
valve means operatively coupled with the individual exhaust vents and sequentially operable for inducing a selected pattern of flow vectors for the reacted gas in the chamber adjacent the substrate in order to enhance deposition uniformity and/or conformance.

16. The CVD reactor of claim 15 wherein the chamber is cylindrical, the multiple exhaust vents being arranged about the cylindrical periphery of the chamber and further comprising at least one additional exhaust vent arranged in a central portion of the chamber, similar valve means being operatively coupled therewith for inducing the selected pattern of flow vectors for the reactant gas.

17. The CVD reactant of claim 16 wherein the valve means are operable for sequentially opening and closing selected combinations of the exhaust vents in various combinations for inducing selected reactant gas flow vector patterns including clockwise swirling motion, counterclockwise swirling motion, radially inward motion, radially outward motion and combinations thereof.

18. The CVD reactor of claim 17 wherein the means for introducing reactant gas comprise restrictive orifices communicating at least one reactant gas manifold with the chamber.

19. The CVD reactor of claim 18 further comprising multiple annular manifolds and a plurality of circumferentially arranged orifices at multiple radial locations communicating each annular manifold with the chamber.

20. The CVD reactor of claim 19 further comprising regulator means for separately communicating each manifold with a gas source or with a vacuum source.

21. The CVD reactor of claim 19 further comprising adjustable baffle means operatively coupled with the orifices for adjusting the injection angle of gas introduced into the chamber.

22. The CVD reactor of claim 15 wherein the means for introducing the reactant gas comprise restrictive orifices communicating at least one reactant gas manifold with the chamber.

23. The CVD reactor of claim 22 further comprising regulator means for communicating each manifold with a gas source or with a vacuum source.

24. The CVD reactor of claim 15 wherein the chamber and the means for supporting the substrate are configured for receiving a single wafer as the substrate.

25. A chemical vapor deposition (CVD) method comprising the steps of
arranging a deposition substrate in a chamber at a selected pressure,
introducing reactant gas into the chamber,
connecting multiple exhaust vents in spaced apart relation with each other and in communication with the chamber, and
selectively regulating communication of the exhaust vents with the chamber for inducing a selected pattern of flow vectors for the reactant gas in the chamber adjacent the substrate in order to enhance deposition uniformity and/or conformance.

26. The CVD method of claim 25 wherein the chamber is generally cylindrical and the multiple exhaust vents include a plurality of vents arranged about the periphery of the cylindrical chamber and at least one centrally arranged exhaust vent, communication of the exhaust vents with the chamber being selectively regulated for sequentially opening and closing selected combinations of the exhaust vents in various combinations for inducing selected reactant gas flow vector patterns including clockwise swirling motion, counterclockwise swirling motion, radial inward motion, radial outward motion and combinations thereof.

27. The CVD method of claim 26 wherein spaced apart restrictive orifices are provided for introducing reactant gas into the chamber and further comprising the step of communicating selected combinations of the orifices with a gas source or gas sources or with a vacuum source.

28. The CVD method of claim 25 further comprising the step of mechanically adjusting the injection angle of reactant gas introduced into the chamber.

29. The CVD method of claim 25 wherein the chamber is configured for receiving and supporting a single wafer as the deposition substrate.

* * * * *